(12) United States Patent
Kwon

(10) Patent No.: US 12,538,815 B2
(45) Date of Patent: Jan. 27, 2026

(54) SEMICONDUCTOR PACKAGE AND METHOD OF FABRICATING THE SAME

(71) Applicant: SAMSUNG ELECTRONICS CO., LTD., Suwon-si (KR)

(72) Inventor: Yong Hwan Kwon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 297 days.

(21) Appl. No.: 18/138,363

(22) Filed: Apr. 24, 2023

(65) Prior Publication Data

US 2024/0014139 A1 Jan. 11, 2024

(30) Foreign Application Priority Data

Jul. 8, 2022 (KR) .................... 10-2022-0084414

(51) Int. Cl.
*H01L 23/00* (2006.01)
*H01L 21/48* (2006.01)
*H01L 23/538* (2006.01)
*H01L 25/00* (2006.01)
*H01L 25/065* (2023.01)

(52) U.S. Cl.
CPC ...... *H01L 23/5383* (2013.01); *H01L 21/4857* (2013.01); *H01L 23/5381* (2013.01); *H01L 24/16* (2013.01); *H01L 24/81* (2013.01); *H01L 25/0655* (2013.01); *H01L 25/50* (2013.01); *H01L 2224/16227* (2013.01); *H01L 2224/81* (2013.01)

(58) Field of Classification Search
CPC ............. H01L 23/5383; H01L 21/4857; H01L 23/5381; H01L 23/31
See application file for complete search history.

(56) References Cited

U.S. PATENT DOCUMENTS

| | | |
|---|---|---|
| 9,312,225 B2 | 4/2016 | Chang et al. |
| 10,453,764 B2 | 10/2019 | Chen et al. |
| 10,504,836 B2 | 12/2019 | Kuroyanagi et al. |
| 10,937,743 B2 | 3/2021 | Chen et al. |
| 2017/0110498 A1 | 4/2017 | Dale et al. |
| 2019/0164893 A1* | 5/2019 | Kim ................... H01L 23/49827 |
| 2019/0189549 A1* | 6/2019 | Jo ......................... H01L 23/5389 |
| 2020/0135594 A1* | 4/2020 | Lee .......................... H01L 24/92 |

(Continued)

*Primary Examiner* — Thao P Le
(74) *Attorney, Agent, or Firm* — Sughrue Mion, PLLC

(57) ABSTRACT

A semiconductor package is provided and includes: a base substrate; an interposer package on the base substrate; and first and second semiconductor chips on the interposer package, wherein the interposer package includes: a first redistribution structure including a first insulating layer, a second insulating layer on the first insulating layer, and first and second redistribution layers respectively disposed on the first and second insulating layers; a bridge chip on a bottom surface of the first redistribution structure; a connection structure on the bottom surface of the first redistribution structure and including a plurality of wiring layers electrically connected to the first and second semiconductor chips; and a bonding structure disposed on a third insulating layer on the second insulating layer and bonding each of the first and second semiconductor chips to the first redistribution structure, wherein the second redistribution layer includes a contact plug within the third insulating layer.

20 Claims, 18 Drawing Sheets

(56) References Cited

U.S. PATENT DOCUMENTS

| | | | |
|---|---|---|---|
| 2020/0135683 A1* | 4/2020 | Kim | H01L 23/481 |
| 2021/0298177 A1* | 9/2021 | Lee | H05K 1/09 |
| 2022/0037261 A1 | 2/2022 | Choi et al. | |
| 2022/0059442 A1 | 2/2022 | Oh et al. | |
| 2022/0077043 A1 | 3/2022 | Kang et al. | |
| 2022/0130799 A1* | 4/2022 | Jang | H01L 24/08 |
| 2022/0359439 A1* | 11/2022 | Lee | H01L 24/16 |
| 2024/0014087 A1* | 1/2024 | Shin | H01L 24/16 |
| 2024/0014139 A1* | 1/2024 | Kwon | H01L 21/4857 |
| 2024/0047328 A1* | 2/2024 | Park | H01L 24/73 |
| 2024/0128175 A1* | 4/2024 | Jang | H01L 23/49866 |
| 2024/0136329 A1* | 4/2024 | Lee | H01L 24/92 |
| 2024/0145396 A1* | 5/2024 | Jang | H01L 23/5389 |
| 2024/0145444 A1* | 5/2024 | Lee | H01L 24/73 |
| 2024/0203854 A1* | 6/2024 | Hwang | H01L 24/16 |
| 2024/0363542 A1* | 10/2024 | Kim | H01L 24/08 |
| 2024/0429203 A1* | 12/2024 | Lin | H01L 23/5385 |
| 2025/0038094 A1* | 1/2025 | Kim | H01L 25/50 |
| 2025/0046769 A1* | 2/2025 | Choi | H01L 24/20 |
| 2025/0054846 A1* | 2/2025 | Kim | H01L 21/6835 |
| 2025/0096218 A1* | 3/2025 | Seong | H01L 25/0652 |
| 2025/0149460 A1* | 5/2025 | Yim | H01L 25/0655 |
| 2025/0183214 A1* | 6/2025 | Ha | H01L 25/105 |

* cited by examiner

SEMICONDUCTOR PACKAGE AND METHOD OF FABRICATING THE SAME

This application is based on and claims priority under 35 U.S.C. § 119 to Korean Patent Application No. 10-2022-0084414, filed on Jul. 8, 2022, in the Korean Intellectual Property Office, the disclosure of which is incorporated by reference herein in its entirety.

BACKGROUND

1. Field

Embodiments of the present disclosure relate to a semiconductor package and a method of fabricating the same.

2. Description of the Related Art

With the trend toward smaller and more highly performing semiconductor chips, the demand for a system-in-package (SIP) structure in which a plurality of semiconductor chips are embedded in one package is increasing in the semiconductor packaging field.

Accordingly, it is beneficial to form a fine circuit corresponding to a fine bump pitch of a semiconductor chip.

SUMMARY

Aspects of embodiments of the present disclosure provide a semiconductor package capable of implementing a fine pattern and a method of fabricating the semiconductor package.

Aspects of embodiments of the present disclosure also provide a semiconductor package with improved product reliability and a method of fabricating the semiconductor package.

However, aspects of embodiments of the present disclosure are not restricted to the one set forth herein. The above and other aspects of embodiments of the present disclosure will become more apparent to one of ordinary skill in the art to which the present disclosure pertains by referencing the detailed description of the present disclosure given below.

According to embodiments of the present disclosure, a semiconductor package is provided. The semiconductor package includes: a base substrate; an interposer package on the base substrate; and a first semiconductor chip and a second semiconductor chip on the interposer package. The interposer package includes a first redistribution structure having a first surface on which the first semiconductor chip and the second semiconductor chip are disposed and a second surface facing in a direction opposite to a facing direction of the first surface. The first redistribution structure includes: a first insulating layer; a second insulating layer on the first insulating layer; a first redistribution layer on the first insulating layer; and a second redistribution layer on the second insulating layer. The interposer package further includes: a bridge chip on the second surface of the first redistribution structure and comprising a bridge circuit electrically connecting the first semiconductor chip and the second semiconductor chip; a connection structure on the second surface of the first redistribution structure and comprising a plurality of wiring layers electrically connected to the first semiconductor chip and the second semiconductor chip; a third insulating layer on the second insulating layer; and bonding structures on the third insulating layer that bond each of the first semiconductor chip and the second semiconductor chip to the first redistribution structure. The second redistribution layer includes, within the third insulating layer, a contact plug protruding from an upper surface of a portion of the second redistribution layer and disposed between the portion of the second redistribution layer and one of the bonding structures.

According to embodiments of the present disclosure, a semiconductor package is provided. The semiconductor package includes: a base substrate; an interposer package on the base substrate; and a plurality of semiconductor chips on the interposer package. The interposer package includes a first redistribution structure having a first surface on which the plurality of semiconductor chips are disposed and a second surface facing in a direction opposite to a facing direction of the first surface. The first redistribution structure includes: a first insulating layer; a second insulating layer on the first insulating layer; a first redistribution layer on the first insulating layer; and a second redistribution layer on the second insulating layer. The interposer package further includes: a bridge chip on the second surface of the first redistribution structure and comprising a bridge circuit electrically connecting the plurality of semiconductor chips; a connection structure on the second surface of the first redistribution structure and comprising a plurality of wiring layers electrically connected to the plurality of semiconductor chips; a third insulating layer on the second insulating layer; and bonding pads on the third insulating that bond each of the plurality of semiconductor chips to the first redistribution structure. The first redistribution structure further includes: a first via structure that is above the first redistribution layer; and a second via structure that is between the first via structure and one of the bonding pads. The second via structure includes: a first metal layer contacting an upper surface of a portion of the second redistribution layer; a second metal layer contacting the one of the bonding pads; and a third metal layer between the first metal layer and the second metal layer.

According to embodiments of the present disclosure, a method of fabricating a semiconductor package is provided. The semiconductor package includes a first redistribution structure electrically connecting a semiconductor chip and a bridge chip, a connection structure including a plurality of wiring layers connected to the semiconductor chip, and a bonding structure on the first redistribution structure and bonded to the semiconductor chip. The method includes forming the first redistribution structure, the forming including: forming a first insulating layer on the bridge chip, a first redistribution layer on the first insulating layer, and a second insulating layer on the first redistribution layer; forming a portion of a second redistribution layer on the second insulating layer using a first resist pattern; removing the first resist pattern and forming a contact plug on the portion of the second redistribution layer using a second resist pattern; removing the second resist pattern and forming a third insulating layer on the contact plug; performing a planarization process so that an upper surface of the contact plug and an upper surface of the third insulating layer are positioned on a same plane; and forming a trench between the upper surface of the contact plug and the upper surface of the third insulating layer by removing a portion of the contact plug. The method further includes providing the bonding structure in the trench.

BRIEF DESCRIPTION OF DRAWINGS

These and/or other aspects will become apparent and more readily appreciated from the following description of example embodiments of the present disclosure, taken in conjunction with the accompanying drawings in which.

DETAILED DESCRIPTION

Hereinafter, non-limiting example embodiments according to the technical spirit of the present disclosure will be described with reference to the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element or layer is referred to as being "directly over," "directly above," "directly on," "directly below," "directly under," "directly beneath," "directly connected to" or "directly coupled to" another element or layer, there are no intervening elements or layers present.

Figure 1:
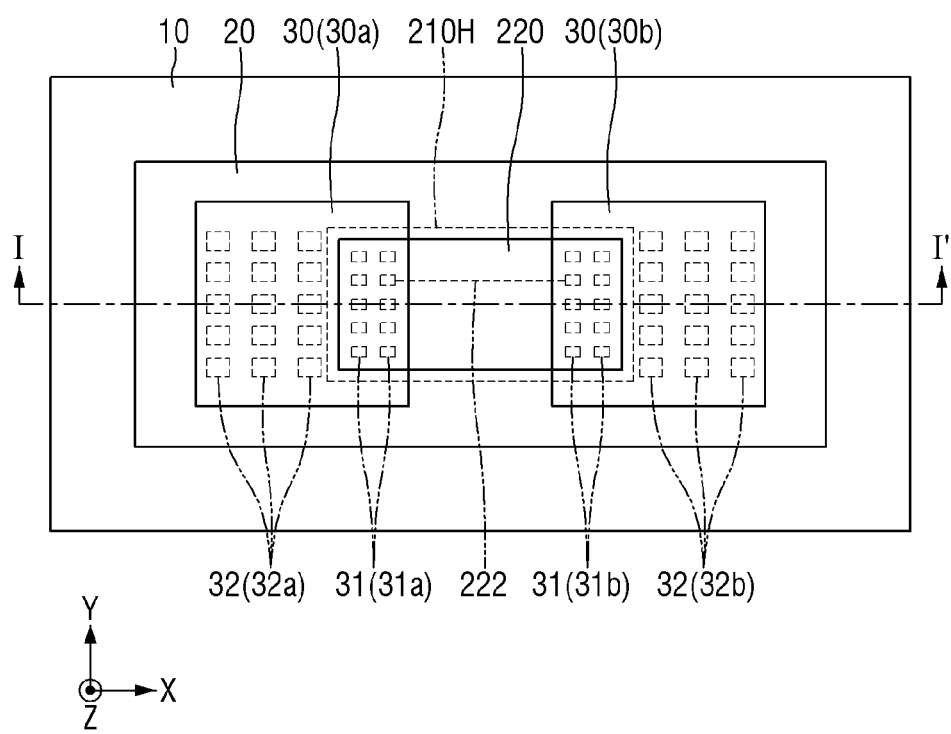
FIG. 1 is a plan view illustrating the schematic configuration of a semiconductor package according to embodiments of the present disclosure.
Figure 2:
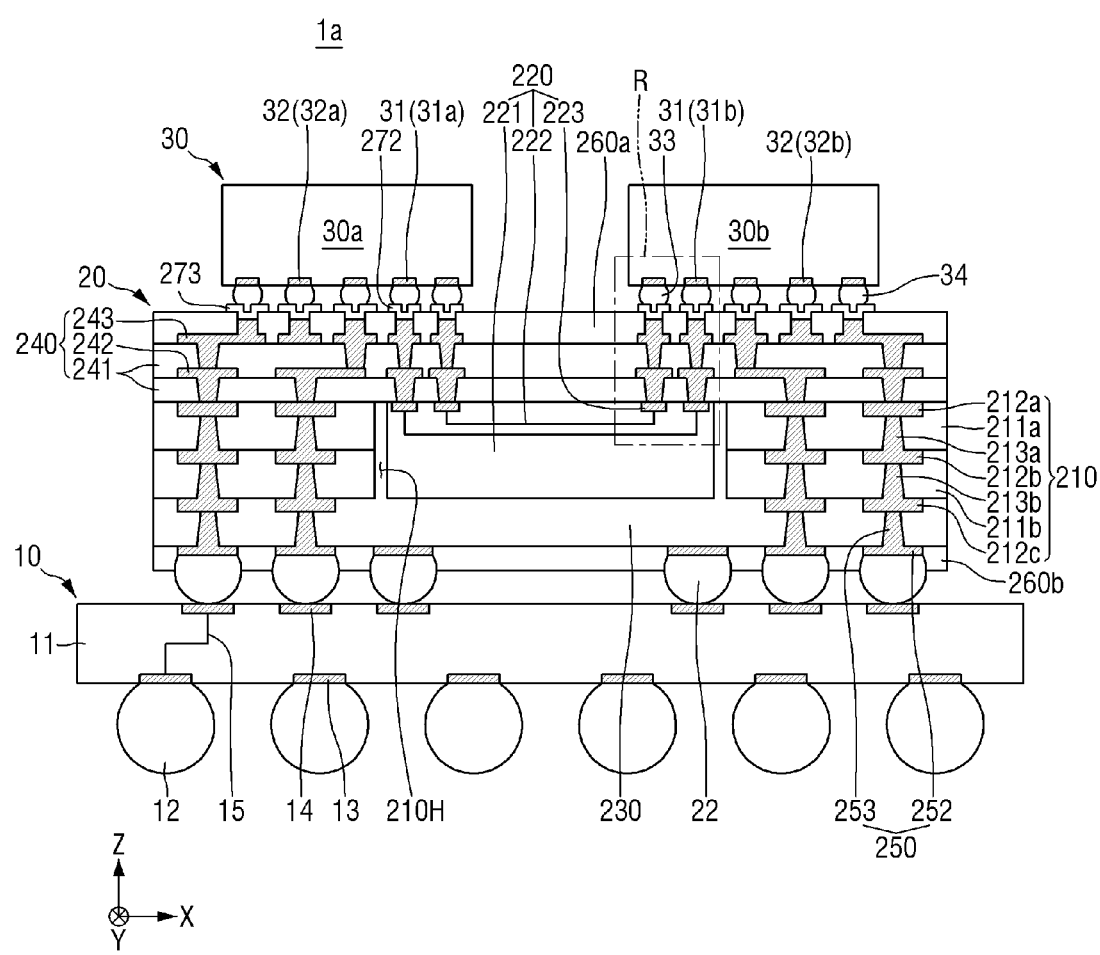
FIG. 2 is a cross-sectional view taken along line I-I' of the semiconductor package of FIG. 1.
Figure 3:
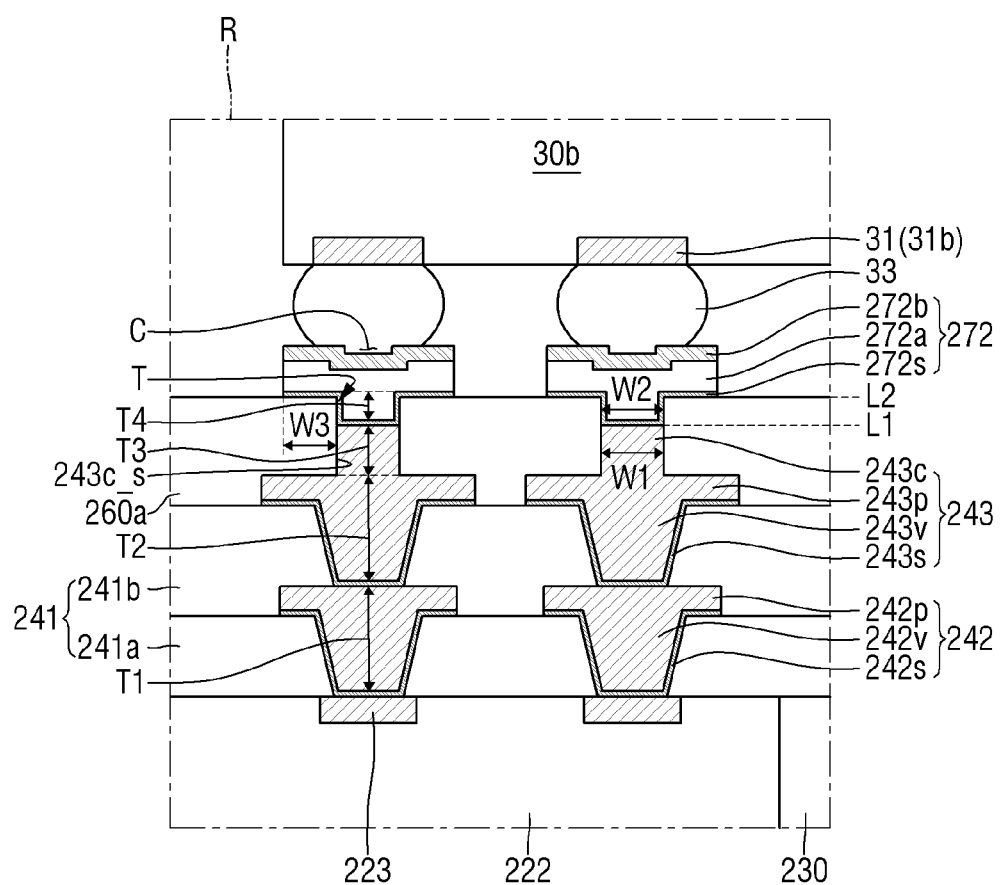
FIG. 3 is an enlarged view of area R of FIG. 2.

FIG. 1 is a plan view illustrating the schematic configuration of a semiconductor package 1a according to embodiments of the present disclosure. FIG. 2 is a cross-sectional view taken along line I-I' of the semiconductor package 1a of FIG. 1. FIG. 3 is an enlarged view of area R of FIG. 2.

Referring to FIGS. 1 and 2, the semiconductor package 1a according to embodiments may include a base substrate 10, an interposer package 20, and a plurality of semiconductor chips 30. In addition, the semiconductor package 1a may further include first internal connection bumps 22, second internal connection bumps 33, third internal connection bumps 34, and external connection bumps 12.

The base substrate 10 may be a support substrate on which the interposer package 20 and the semiconductor chips 30 are mounted in a direction (Z direction) perpendicular to an upper surface of the base substrate 10. The base substrate 10 may include a substrate body 11, substrate connection pads 13 and 14 disposed on lower and upper surfaces of the substrate body 11, and a circuit layer 15 electrically connecting the substrate connection pads 13 and 14. The base substrate 10 may be a substrate for a semiconductor package such as a printed circuit board (PCB), a ceramic substrate, a glass substrate, or a tape wiring board.

The substrate body 11 may include a different material according to the type of the base substrate 10. For example, when the base substrate 10 is a PCB, the substrate body 11 may be a copper clad laminate or may be in a form in which a wiring layer is additionally laminated on one surface or both surfaces of a copper clad laminate. A lower passivation layer and an upper passivation layer coated with solder resist may be formed on the lower surface and the upper surface of the substrate body 11, respectively.

The substrate connection pads 13 and 14 may include at least one metal or an alloy including two or more metals selected from copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C).

The circuit layer 15 may form an electrical path connecting a lower surface and the upper surface of the base substrate 10. The circuit layer 15 may include single- or multi-layered wiring layers formed inside the substrate body 11 and a via connecting the wiring layers. The circuit layer 15 may include at least one metal or an alloy including two or more metals selected from copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C).

The interposer package 20 may be disposed on the upper surface of the base substrate 10 and may include a first redistribution structure 240, a bridge chip 220, a connection structure 210, a first bonding structure 272, a second bonding structure 273, an encapsulant 230, and second redistribution structures 250.

The first redistribution structure 240 may include a first surface on which the semiconductor chips 30 are disposed and a second surface facing in a direction opposite to a facing direction of the first surface.

Referring to FIGS. 2 and 3, the first redistribution structure 240 may include a plurality of insulating layers 241 and a plurality of redistribution layers (e.g., a first redistribution layer 242 and a second redistribution layer 243). The insulating layers 241 may include a first insulating layer 241a and a second insulating layer 241b on the first insulating layer 241a. The redistribution layers may include a first redistribution layer 242 and a second redistribution layer 243 respectively disposed on the first insulating layer 241a and the second insulating layer 241b.

The first insulating layer 241a and the second insulating layer 241b may include an insulating material. The insulating material may include a thermosetting resin such as epoxy resin, a thermoplastic resin such as polyimide, or a resin obtained by impregnating any one of the above resins with an inorganic filler and/or a glass fiber (e.g., glass fiber, glass cloth, or glass fabric), for example, prepreg, ajinomoto build-up film (ABF), FR-4, or bismaleimide triazine (BT). In addition, the first insulating layer 241a and the second insulating layer 241b may include a photosensitive resin such as a photoimagable dielectric (PID) resin. In this case, the first insulating layer 241a and the second insulating layer 241b may be formed thinner, and a first redistribution via 242v and a second redistribution via 243v may be formed finer.

Although two insulating layers are illustrated in FIG. 3, the number of insulating layers may be two or more. In this case, the insulating layers may include the same material or different materials, and a boundary between the insulating layers at different levels may be unclear depending on a process.

The first redistribution structure 240 may include the first redistribution layers 242 penetrating at least a portion of the first insulating layer 241a. The first redistribution layers 242 of the first redistribution structure 240 may be electrically connected to wiring layers of the connection structure 210 or the bridge chip 220.

The first redistribution structure 240 may include the second redistribution layers 243 penetrating at least a portion of the second insulating layer 241b. The second redistribution layers 243 of the first redistribution structure 240 may be electrically connected to the wiring layers of the connection structure 210 or the bridge chip 220.

The first redistribution layer 242 and the second redistribution layer 243 may be respectively disposed on the first insulating layer 241a and the second insulating layer 241b and may face the semiconductor chips 30. The first redistribution layer 242 and the second redistribution layer 243 may redistribute interconnection pads 31 and external connection pads 32 of the semiconductor chips 30.

The first redistribution layer 242 and the second redistribution layer 243 may perform various functions according to their design. For example, the first redistribution layer 242 and the second redistribution layer 243 may include a ground pattern, a power pattern, and a signal pattern. The signal pattern may include various signals (e.g., a data signal) other than the ground pattern and the power pattern. The ground pattern and the power pattern may be the same pattern.

The first redistribution structure 240 may include a first redistribution circuit connecting a first semiconductor chip 30a to a bridge circuit 222 to be described later, a second redistribution circuit connecting a second semiconductor chip 30b to the bridge circuit 222 to be described later, and a third redistribution circuit connecting each of the first semiconductor chip 30a and the second semiconductor chip 30b to wiring layers 212a of the connection structure 210 to be described later.

The first redistribution circuit may be connected to first interconnection pads 31a of the first semiconductor chip 30a through the second internal connection bumps 33. The second redistribution circuit may be connected to second interconnection pads 31b of the second semiconductor chip 30b through the second internal connection bumps 33. The third redistribution circuit may be connected to external connection pads (e.g., first external connections pads 32a and second external connection pads 32b) of the first semiconductor chip 30a and the second semiconductor chip 30b through the third internal connection bumps 34.

The first redistribution circuit and the second redistribution circuit may be electrically connected to each other through the bridge circuit 222 of the bridge chip 220 which will be described later. Therefore, the first semiconductor chip 30a and the second semiconductor chip 30b may be electrically connected to each other through the first redistribution circuit, the second redistribution circuit, and the bridge circuit 222. The third redistribution circuit may be electrically connected to each of the semiconductor chips 30 and may be electrically connected to the circuit layer 15 of the base substrate 10 through the connection structure 210 and the second redistribution structures 250 which will be described later.

The first redistribution layer 242 and the second redistribution layer 243 may include a metal material including, for example, copper (Cu), aluminum (Al), silver (Ag), tin (Sn), gold (Au), nickel (Ni), lead (Pb), titanium (Ti), or an alloy thereof. Each of the first redistribution layer 242 and the second redistribution layer 243 may be formed by a known plating process and may include a seed layer and a conductor layer.

The bridge chip 220 may be disposed on the second surface of the first redistribution structure 240 and may include a chip body 221, the bridge circuit 222, and bridge pads 223. In order to connect the semiconductor chips 30, the bridge chip 220 may be formed to have a size or a horizontal area that allows a portion of the chip body 221 to overlap the semiconductor chips 30 in a vertical direction (Z direction). The bridge chip 220 may include a process chip, a logic chip, a memory chip, or the like.

The chip body 221 may be formed based on ceramic, glass, semiconductor, or the like. For example, the chip body 221 may be formed based on a wafer and may include silicon (Si), germanium (Ge), gallium arsenide (GaAs), or the like. A passivation layer may be formed on a surface of the chip body 221 to protect the chip body 221 from external physical and chemical damage. The passivation layer may be formed of an oxide layer or a nitride layer or may be formed of a double layer of an oxide layer and a nitride layer. For example, the passivation layer may be formed of a silicon oxide ($SiO_2$) layer, a silicon nitride ($SiN_x$) layer, or a combination thereof.

The bridge circuit 222 may be formed on the surface of the chip body 221, for example, may be formed in the passivation layer formed on the surface of the chip body 221. The bridge circuit 222 may have a pitch corresponding to a fine pitch of the interconnection pads 31 of the semiconductor chips 30 and may electrically connect the first redistribution circuit and the second redistribution circuit. The bridge circuit 222 may serve as a bridge electrically connecting the semiconductor chips 30 by connecting the interconnection pads 31 respectively included in the semiconductor chips 30 to each other.

The bridge pads 223 may be disposed on the surface of the chip body 221, for example, may be formed on a surface of or inside the passivation layer formed on the surface of the chip body 221 and may provide connection points of the bridge circuit 222 and the first and second redistribution circuits.

The connection structure 210 may be disposed on the second surface of the first redistribution structure 240 and may include frame insulating layers (e.g., a first frame insulating layer 211a and a second frame insulating layer 211b), a plurality of wiring layers (e.g., first wiring layers 212a, second wiring layers 212b, and third wiring layers 212c) disposed at different levels of the frame insulating layers, and wiring vias (e.g., a first wiring via 213a and a second wiring via 213b) electrically connecting the wiring layers. In addition, the connection structure 210 may have a through hole 210H penetrating the frame insulating layers (e.g., the first frame insulating layer 211a and the second frame insulating layer 211b) and accommodating the bridge chip 220.

The connection structure 210 may improve the rigidity of the package according to the material of the frame insulating layers and may secure the thickness uniformity of the encapsulant 230. Wall surfaces of the through hole 210H may continuously surround the bridge chip 220, but embodiments of the present disclosure are not limited thereto.

For example, the connection structure 210 may include a first frame insulating layer 211a in contact with the second surface of the first redistribution structure 240, first wiring layers 212a in contact with the second surface of the first redistribution structure 240 and buried in the first frame insulating layer 211a, second wiring layers 212b disposed on a surface opposite to the surface where the first wiring layers 212a of the first frame insulating layer 211a are buried, a second frame insulating layer 211b disposed on the first frame insulating layer 211a and covering the second wiring layers 212b, third wiring layers 212c disposed on the second frame insulating layer 211b, first wiring vias 213a penetrating the first frame insulating layer 211a to electrically connect the first wiring layers 212a and the second wiring layers 212b, and second wiring vias 213b penetrating the second frame insulating layer 211b to electrically connect the second wiring layers 212b and the third wiring layers 212c.

The frame insulating layers (e.g., the first frame insulating layer 211a and the second frame insulating layer 211b) may include an insulating material. For example, the insulating material may include a thermosetting resin such as epoxy resin, a thermoplastic resin such as polyimide, or a resin obtained by mixing any one of the above resins with an inorganic filler and/or a glass fiber (glass fiber, glass cloth, or glass fabric). For example, ajinomoto build-up film (ABF) or prepreg may be used.

The wiring layers (e.g., the first wiring layers 212a, the second wiring layers 212b, and the third wiring layers 212c) may provide an electrical path connecting an upper portion and a lower portion of the package, together with the wiring vias (e.g., the first wiring via 213a and the second wiring via 213b). The wiring layers may include copper (Cu), aluminum (Al), silver (Ag), tin (Sn), gold (Au), nickel (Ni), lead (Pb), titanium (Ti), or an alloy thereof. Each of the wiring layers may be formed by a known plating process and may include a seed layer and a conductor layer.

The wiring layers (e.g., the first wiring layers 212a, the second wiring layers 212b, and the third wiring layers 212c) may include a ground pattern, a power pattern, and a signal pattern according to their design. In addition, each of the wiring layers may include various types of via pads.

The wiring vias (e.g., the first wiring via 213a and the second wiring via 213b) may electrically connect the wiring layers (e.g., the first wiring layers 212a, the second wiring layers 212b, and the third wiring layers 212c) formed on different layers to form an electrical path vertically penetrating the connection structure 210. The wiring vias may include copper (Cu), aluminum (Al), silver (Ag), tin (Sn), gold (Au), nickel (Ni), lead (Pb), titanium (Ti), or an alloy thereof. The wiring vias may include a signal via, a power via and a ground via, and the power via and the ground via may be the same via. Each of the wiring vias may be a field-type via filled with a metal material or may be a conformal-type via having a metal material formed along wall surfaces of a via hole. Each of the wiring vias may be formed by a plating process and may be composed of a seed layer and a conductor layer.

The encapsulant 230 may be disposed on the second surface of the first redistribution structure 240 and may at least partially encapsulate the connection structure 210 and the bridge chip 220. The encapsulant 230 may include, for example, a thermosetting resin such as epoxy resin, a thermoplastic resin such as polyimide, or prepreg, ajinomoto build-up film (ABF), FR-4, bismaleimide triazine (BT) or epoxy molding compound (EMC) including an inorganic filler or/and glass fiber. The encapsulant 230 may include a different type of insulating material from the insulating layers 241 of the first redistribution structure 240 and the frame insulating layers (e.g., the first frame insulating layer 211a and the second frame insulating layer 211b) of the connection structure 210.

Each of the second redistribution structures 250 may be disposed on the encapsulant 230 and may include a third redistribution layer 252 facing the base substrate 10 and a third redistribution via 253 penetrating a portion of the encapsulant 230 to electrically connect the third redistribution layer 252 to the third wiring layers 212c of the connection structure 210. The third redistribution layer 252 and the third redistribution via 253 may have characteristics substantially similar to those of the first redistribution via pad 242p, the second redistribution via pad 243p, the first redistribution via 242v, and the second redistribution via 243v of FIGS. 2 and 3, and thus a description thereof may be omitted.

The interposer package 20 may further include a third insulating layer 260a and a protective layer 260b covering the first bonding structure 272 and the second bonding structure 273 to be described later and the third redistribution layer 252. The third insulating layer 260a and the protective layer 260b may protect the first bonding structure 272 and the second bonding structure 273 and the third redistribution layer 252 disposed at outermost positions from external physical and chemical damage. The third insulating layer 260a and the protective layer 260b may have a plurality of openings that at least partially expose first bonding structure 272 and the second bonding structure 273 and the third redistribution layer 252 disposed at the outermost positions.

The third insulating layer 260a and the protective layer 260b may include an insulating material such as prepreg, ABF, FR-4, BT, or solder resist. The third insulating layer 260a may include a photosensitive material like the first insulating layer 241a and the second insulating layer 241b or may include a non-photosensitive material unlike the first insulating layer 241a and the second insulating layer 241b.

The semiconductor chips 30 may be spaced apart from each other in a horizontal direction (X direction and Y direction) on the interposer package 20. Each of the semiconductor chips 30 may at least partially overlap the bridge chip 220 of the interposer package 20 in a direction (Z direction) perpendicular to the interposer package 20. Each of the semiconductor chips 30 may include the interconnection pads 31 connected to each other through the first redistribution layer 242, the second redistribution layer 243, and the bridge circuit 222 and the external connection pads 32 connected to the circuit layer 15 of the base substrate 10 through the first redistribution layer layers 242, the second redistribution layer 243 and the wiring layers (e.g., the first wiring layers 212a, the second wiring layers 212b, and the third wiring layers 212c) of the connection structure 210.

For example, the semiconductor chips 30 may include the first semiconductor chip 30a and the second semiconductor chip 30b, each being disposed on the interposer package 20 and overlapping at least a portion of the bridge chip 220. The first semiconductor chip 30a and the second semiconductor chip 30b may include different types of semiconductor chips. For example, the first semiconductor chip 30a may include an application processor chip such as a central processor (e.g., a CPU), a graphic processor (e.g., a GPU), a digital signal processor, an encryption processor, a microprocessor or a microcontroller and a logic chip such as an analog-digital converter or an application-specific IC (ASIC), and the second semiconductor chip 30b may include a memory chip such as a volatile memory (e.g., a DRAM), a non-volatile memory (e.g., a ROM) or a flash memory. Alternatively, the first semiconductor chip 30a and the second semiconductor chip 30b may include the same type of semiconductor chip. For example, both the first semiconductor chip 30a and the second semiconductor chip 30b may include a logic chip.

The first semiconductor chip 30a may include a plurality of first interconnection pads 31a disposed in an area overlapping the bridge chip 220 in the vertical direction (Z direction) and a plurality of first external connection pads 32a disposed in an area not overlapping the bridge chip 220. The second semiconductor chip 30b may include a plurality of second interconnection pads 31b disposed in an area overlapping the bridge chip 220 in the vertical direction (Z direction) and a plurality of second external connection pads 32b disposed in an area not overlapping the bridge chip 220.

The external connection bumps 12, the first internal connection bumps 22, the second internal connection bumps 33, and the third internal connection bumps 34 may have, for example, a flip-chip connection structure having solder balls, conductive bumps, or a grid array such as a pin grid array, a ball grid array or a land grid array. The external connection bumps 12 may be electrically connected to the substrate connection pads 13 on the lower surface of the base substrate 10 and may be electrically connected to an external device such as a module substrate or a system board.

The first internal connection bumps 22 may be disposed between the base substrate 10 and the interposer package 20 and may electrically connect the third redistribution layers 252 of the second redistribution structures 250 to the circuit layer 15 of the base substrate 10.

The second internal connection bumps 33 may connect the first interconnection pads 31a and the second interconnection pads 31b of the first semiconductor chip 30a and the second semiconductor chip 30b to the first redistribution layer 242 and the second redistribution layer 243 of the first redistribution structure 240.

The third internal connection bumps 34 may connect the first external connection pads 32a and the second external connection pads 32b of the first semiconductor chip 30a and the second semiconductor chip 30b to the first redistribution layer 242 and the second redistribution layer 243 of the first redistribution structure 240.

The first bonding structure 272 and the second bonding structure 273 may be disposed on the third insulating layer 260a on the second insulating layer 241b. The first bonding structure 272 and the second bonding structure 273 may bond each of the first semiconductor chip 30a and the second semiconductor chip 30b to the first redistribution structure 240.

Figure 13:
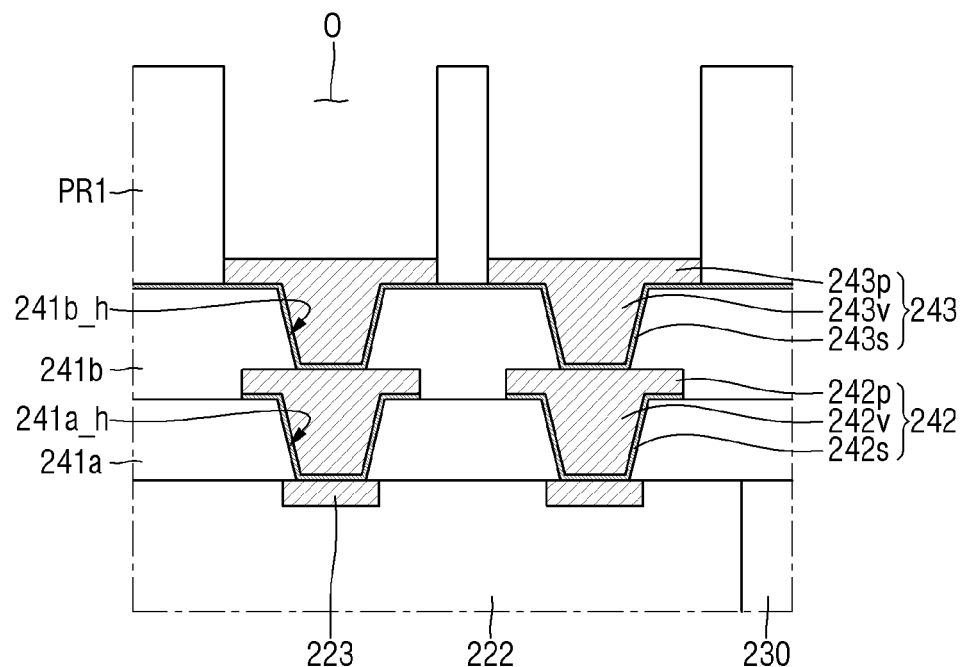
FIGS. 13 through 18 are views schematically illustrating a method of fabricating a semiconductor package according to embodiments of the present disclosure.

Referring to FIGS. 3 and 13 to be described later, each of the first redistribution layers 242 may include a first metal layer 242s formed along a first via hole 241a_h penetrating at least a portion of the first insulating layer 241a, a first redistribution via 242v disposed on the first metal layer 242s and filling the first via hole 241a_h, and a first redistribution via pad 242p on the first redistribution via 242v.

Each of the second redistribution layers 243 may include a second metal layer 243s formed along a second via hole 241b_h penetrating at least a portion of the second insulating layer 241b, a second redistribution via 243v disposed on the second metal layer 243s and filling the second via hole 241b_h, and a second redistribution via pad 243p on the second redistribution via 243v.

The first redistribution via 242v may penetrate at least a portion of the first insulating layer 241a. The first redistribution via 242v may electrically connect a first redistribution layer 242 to a wiring layer of the connection structure 210 or the bridge chip 220. Alternatively, the first redistribution via 242v may electrically connect the first redistribution layer 242 and the second redistribution layer 243 located at different levels.

The second redistribution via 243v may penetrate at least a portion of the second insulating layer 241b. The second redistribution via 243v may electrically connect a second redistribution layer 243 to a wiring layer of the connection structure 210 or the bridge chip 220. Alternatively, the second redistribution via 243v may electrically connect a second redistribution layer 243 to one of the first bonding structure 272 and the second bonding structure 273 located at a different level from the second distribution layer 243.

Each of the second redistribution layers 243 may include, within the third insulating layer 260a, a contact plug 243c protruding from an upper surface of the second redistribution layer 243 and disposed between the second redistribution layer 243 and one of the first bonding structure 272 and the second bonding structure 273.

The contact plug 243c may include a lower surface contacting an upper surface of the second redistribution via pad 243p of a second redistribution layer 243, an upper surface facing the lower surface and contacting one of the first bonding structure 272 and the second bonding structure 273, and a sidewall 243c_s connecting the lower surface and the upper surface.

The sidewall 243c_s of the contact plug 243c may contact the third insulating layer 260a. Since a barrier layer or a seed layer is not interposed between the sidewall 243c_s of the contact plug 243c and the third insulating layer 260a, the sidewall 243c_s of the contact plug 243c may directly contact the third insulating layer 260a.

The upper surface of the contact plug 243c may be disposed at a lower level than a level of an upper surface of the third insulating layer 260a. Since an etch-back process is performed on the contact plug 243c as will be described later, a position L1 of the upper surface of the contact plug 243c may be at a lower level than a level of a position L2 of the upper surface of the third insulating layer 260a.

A width W1 of the sidewall 243c_s of the contact plug 243c in a direction (X direction or Y direction) parallel to the upper surface of the base substrate 10 may be constant. In this case, the width W1 of the sidewall 243c_s of the contact plug 243c may be smaller than or equal to a maximum width of the second redistribution via 243v. In addition, a slope of the sidewall 243c_s of the contact plug 243c with respect to the direction (X direction) parallel to the upper surface of the base substrate 10 may be constant.

As will be described later, since the contact plug 243c is formed on the second redistribution via pad 243p using a resist pattern, the width W1 of the sidewall 243c_s of the contact plug 243c may be constant along a third direction Z. Accordingly, the sidewall 243c_s may not have a tapered shape but may have a shape with a constant slope in the direction Z perpendicular to the upper surface of the base substrate 10.

Each of the first bonding structures 272 may include a third metal layer 272s formed along a trench T penetrating at least a portion of the third insulating layer 260a, a first bonding pad 272a disposed on the third metal layer 272s and filling the trench T, and a second bonding pad 272b disposed on the first bonding pad 272a. The first bonding pad 272a may not directly contact the third insulating layer 260a because the third metal layer 272s serving as a seed layer is interposed between the first bonding pad 272a and the third insulating layer 260a.

Although only the connection structure between the first bonding structures 272 and the first redistribution layer 242 and the second redistribution layer 243 is illustrated in FIG. 3, the technical content of the present disclosure is also applicable to the connection structure between the second bonding structures 273 and the first redistribution layer 242 and the second redistribution layer 243.

The contact plug 243c and the third metal layer 272s may directly contact each other. The third metal layer 272s and the third insulating layer 260a may directly contact each other.

In addition, the width W1 of the sidewall 243c_s of the contact plug 243c and a width W2 of the trench T in the third insulating layer 260a may be equal to each other. Since an etch-back process is performed on the contact plug 243c and a first bonding structure 272 is formed in a removed area, the width W1 of the sidewall 243c_s of the contact plug 243c and the width W2 of the trench T in the third insulating layer 260a may be substantially equal.

A recess C may be formed within an upper surface of the second bonding pad 272b to correspond to the trench T. The recess C may be filled with one of the second internal connection bumps 33 connecting the first semiconductor chip 30a and the second semiconductor chip 30b to the first redistribution structure 240 and the second redistribution structure 250, respectively.

Based on the vertical direction Z, a first via structure disposed between and connecting each first redistribution layer 242 and each second redistribution layer 243 and a second via structure disposed between and connecting each second redistribution layer 243 and each first bonding structure 272 may be defined.

The first via structure may correspond to each area including the second redistribution via 243v and the second metal layer 243s. For example, the second redistribution via 243v may include copper (Cu), and the second metal layer 243s may include at least one or a combination of titanium (Ti), TiW, tantalum (Ta), copper (Cu), and nickel (Ni).

The second via structure may correspond to each area including the contact plug 243c, the first bonding pad 272a, and the third metal layer 272s between the contact plug 243c and the first bonding pad 272a. The contact plug 243c may be integrally formed with the second redistribution via 243v. For example, the contact plug 243c may include copper (Cu), the first bonding pad 272a may include nickel (Ni), and the third metal layer 272s may include at least one or a combination of titanium (Ti), TiW, tantalum (Ta), copper (Cu), and nickel (Ni).

In this case, the second via structure, unlike the first via structure, may include three metal layers including three different types of metal materials. However, embodiments of the present disclosure are not limited thereto.

The sum of a thickness T3 of the contact plug 243c and a thickness T2 of the second redistribution via 243v and the second redistribution via pad 243p may be greater than a thickness T1 of the first redistribution via 242v and the first redistribution via pad 242p in the direction (Z direction) perpendicular to the upper surface of the base substrate 10. The thicknesses of the second redistribution via pad 243p and the first redistribution via pad 242p may be substantially equal to each other.

Since the contact plug 243c is integrally formed on the second redistribution via pad 243p, redistribution vias disposed at different levels within their respective insulating layers may have different thicknesses. That is, a total thickness of the second redistribution via 243v and the contact plug 243c of the second insulating layer 241b adjacent to an outermost area of the first redistribution structure 240 may be greater than the thickness of the first redistribution via 242v of the first insulating layer 241a.

In addition, the thickness T3 of the contact plug 243c may be greater than a thickness T4 of the first bonding pad 272a in the direction (Z direction) perpendicular to the upper surface of the base substrate 10. While an etch-back process is performed on the contact plug 243c and a first bonding structure 272 is formed in a removed area, the thickness T3 of the contact plug 243c may be formed to be greater than the thickness T4 of the first bonding pad 272a.

In the current embodiment, a contact plug having a predetermined width and slope may be formed in a redistribution layer to prevent a bonding pad connecting a bump and a redistribution via from becoming excessively large in size. Accordingly, a maximum distance from an outer side surface of the bonding pad to a sidewall 243c_s of the contact plug may be reduced, and a separation distance between bonding pads may be secured. For example, referring to FIG. 3, a maximum distance W3 from an outer surface of the first bonding pad 272a to the sidewall 243c_s of the contact plug 243c may be less than 7.5 μm.

In addition, through an etch-back process for removing a portion of the contact plug, it is possible to minimize a difference in height between upper surfaces of bonding pads.

As a result, it is possible to more reliably form a fine circuit corresponding to a fine bump pitch of a semiconductor chip.

Figure 4:
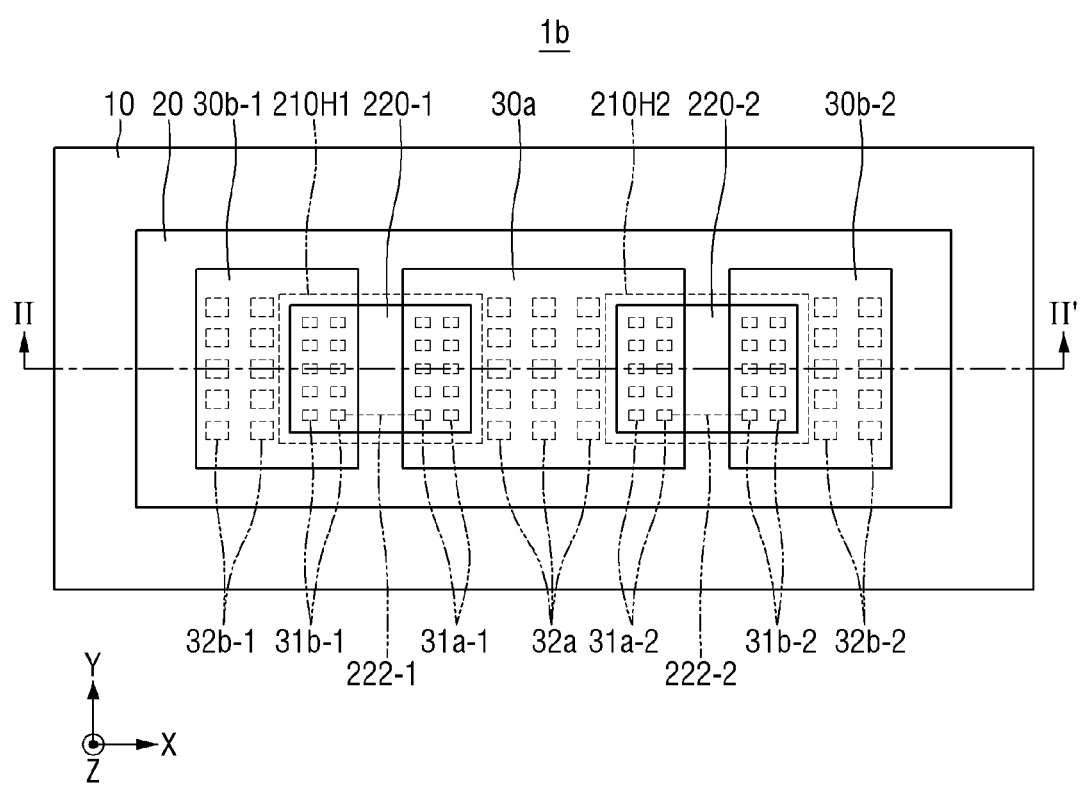
FIG. 4 is a plan view illustrating the schematic configuration of a semiconductor package according to embodiments of the present disclosure.
Figure 5:
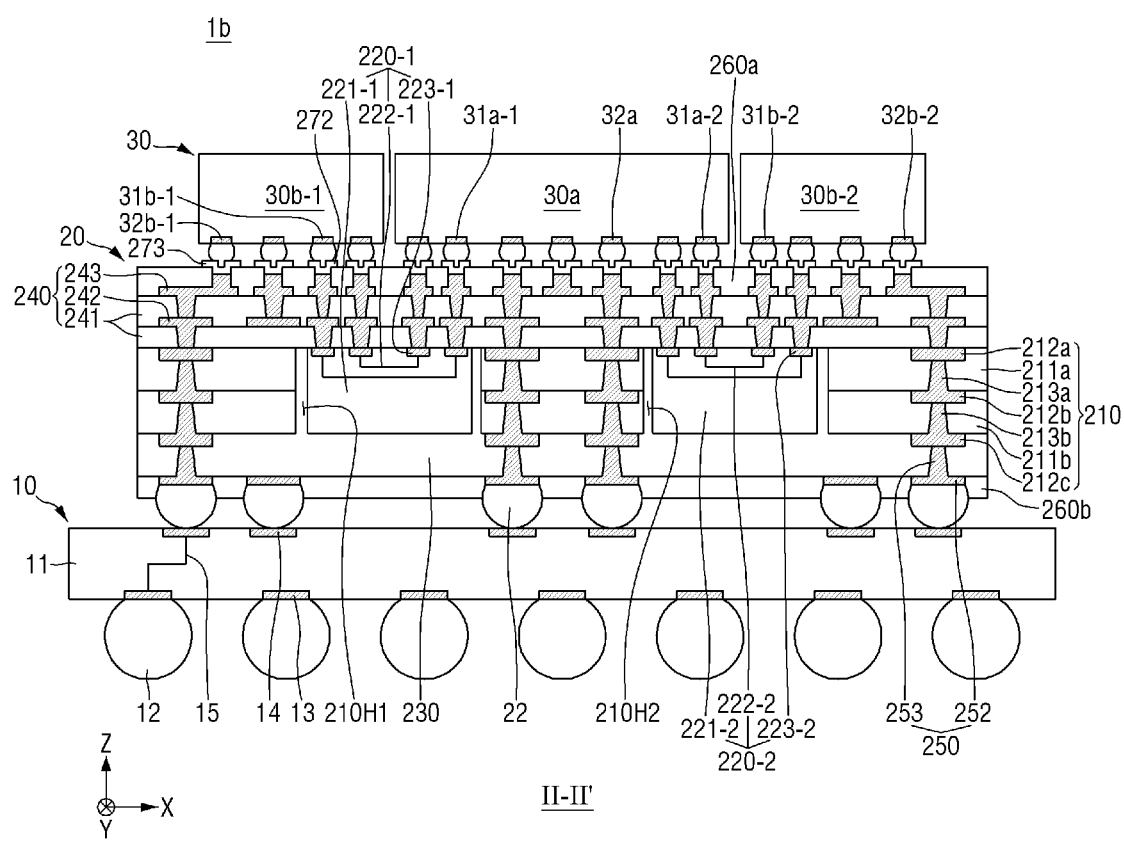
FIG. 5 is a cross-sectional view of the semiconductor package of FIG. 4, taken along line II-II'.

FIG. 4 is a plan view illustrating the schematic configuration of a semiconductor package 1b according to embodiments of the present disclosure. FIG. 5 is a cross-sectional view of the semiconductor package 1b of FIG. 4, taken along line II-II'. For ease of description, repeated description of the same elements and features as those described with reference to FIGS. 1 through 3 may not be provided below.

Referring to FIGS. 4 and 5, the semiconductor package 1b may include a plurality of second semiconductor chips 30b-1 and 30b-2 surrounding a first semiconductor chip 30a and a plurality of bridge chips (e.g., a first bridge chip 220-1 and a second bridge chip 220-2) respectively electrically connecting the second semiconductor chips 30b-1 and 30b-2 to the first semiconductor chip 30a. An interposer package 20 or a connection structure 210 (see FIG. 5) of the interposer package 20 may have a plurality of through holes (e.g., a first through hole 210H1 and a second through hole 210H2) respectively accommodating the bridge chips (e.g., the first bridge chip 220-1 and the second bridge chip 220-2). The second semiconductor chips 30b-1 and 30b-2 may be spaced apart from each other in the horizontal direction (X direction).

The first semiconductor chip 30a may be disposed between the second semiconductor chips 30b-1 and 30b-2 spaced apart from each other. However, the arrangement relationship between the first semiconductor chip 30a and the second semiconductor chips 30b-1 and 30b-2 is not limited thereto. The second semiconductor chips 30b-1 and 30b-2 may be disposed adjacent to upper and lower surfaces of the first semiconductor chip 30a as well as to left and right surfaces of the first semiconductor chip 30a.

For example, the interposer package 20 may include a first bridge chip 220-1 disposed in a first through hole 210H1 and a second bridge chip 220-2 disposed in a second through hole 210H2. The first semiconductor chip 30a and second semiconductor chips 30b-1 and 30b-2 may have areas overlapping the first bridge chip 220-1 and the second bridge chip 220-2.

First interconnection pads 31a-1 disposed in an area overlapping the first bridge chip 220-1 may be electrically connected to $(2-1)^{th}$ interconnection pads 31b-1 disposed in an area overlapping the first bridge chip 220-1 through a first bridge circuit 222-1. In addition, first interconnection pads 31a-2 disposed in an area overlapping the second bridge chip 220-2 may be electrically connected to $(2-2)^{th}$ interconnection pads 31b-2 disposed in an area overlapping the second bridge chip 220-2 through a second bridge circuit 222-2.

Among the elements illustrated in FIGS. 4 and 5, elements having the same reference numerals as those of FIGS. 1 and 2 have similar technical features to those of FIGS. 1 and 2 and thus repetitive description thereof may not be provided.

Figure 6:
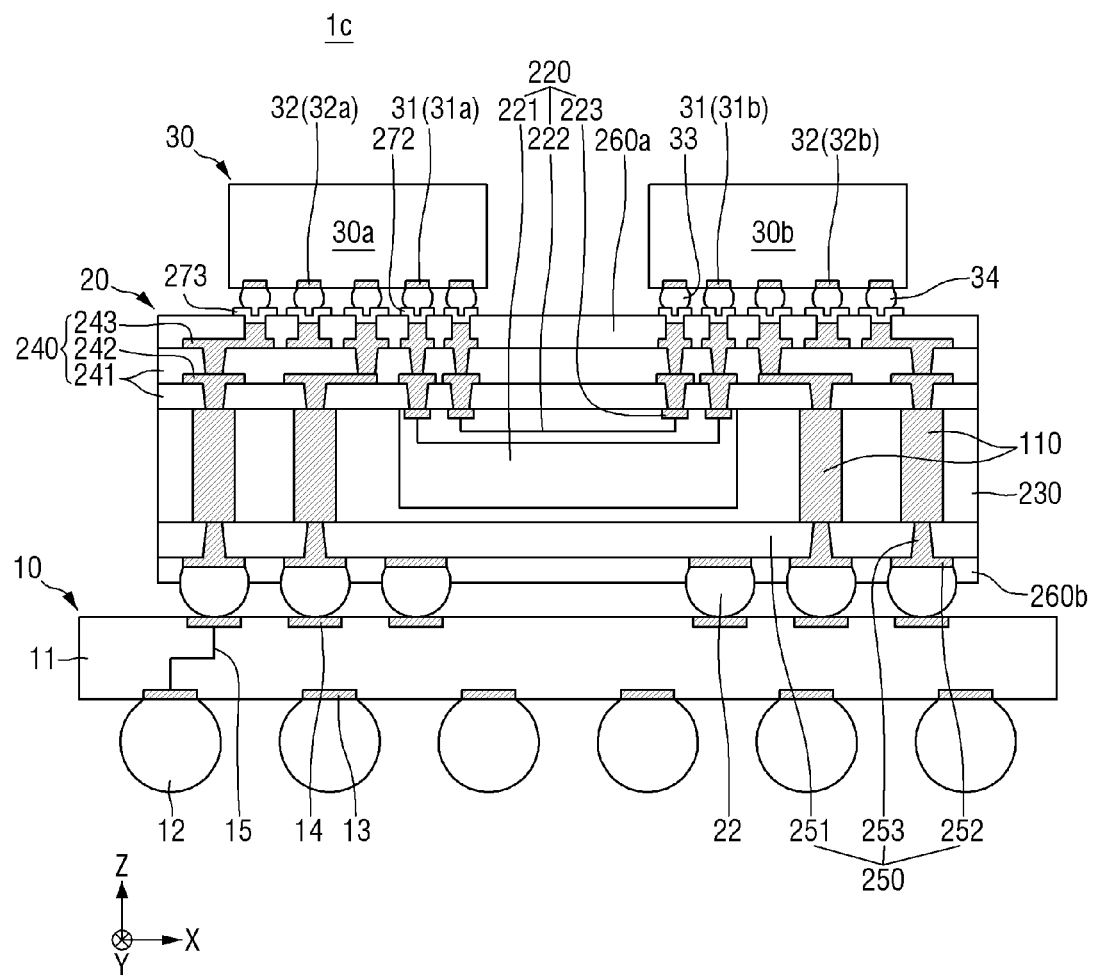
FIG. 6 is a cross-sectional view of a semiconductor package according to embodiments of the present disclosure.
Figure 7:
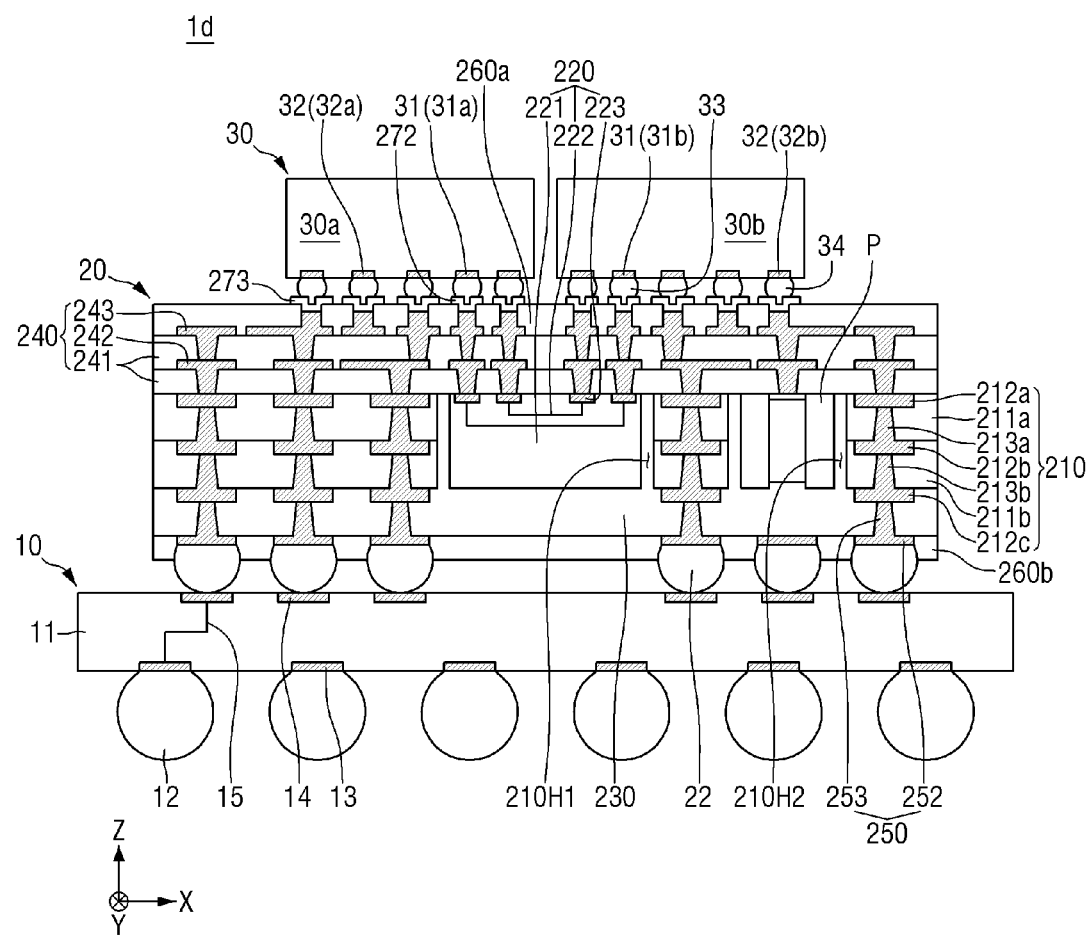
FIG. 7 is a cross-sectional view of a semiconductor package according to embodiments of the present disclosure.
Figure 8:
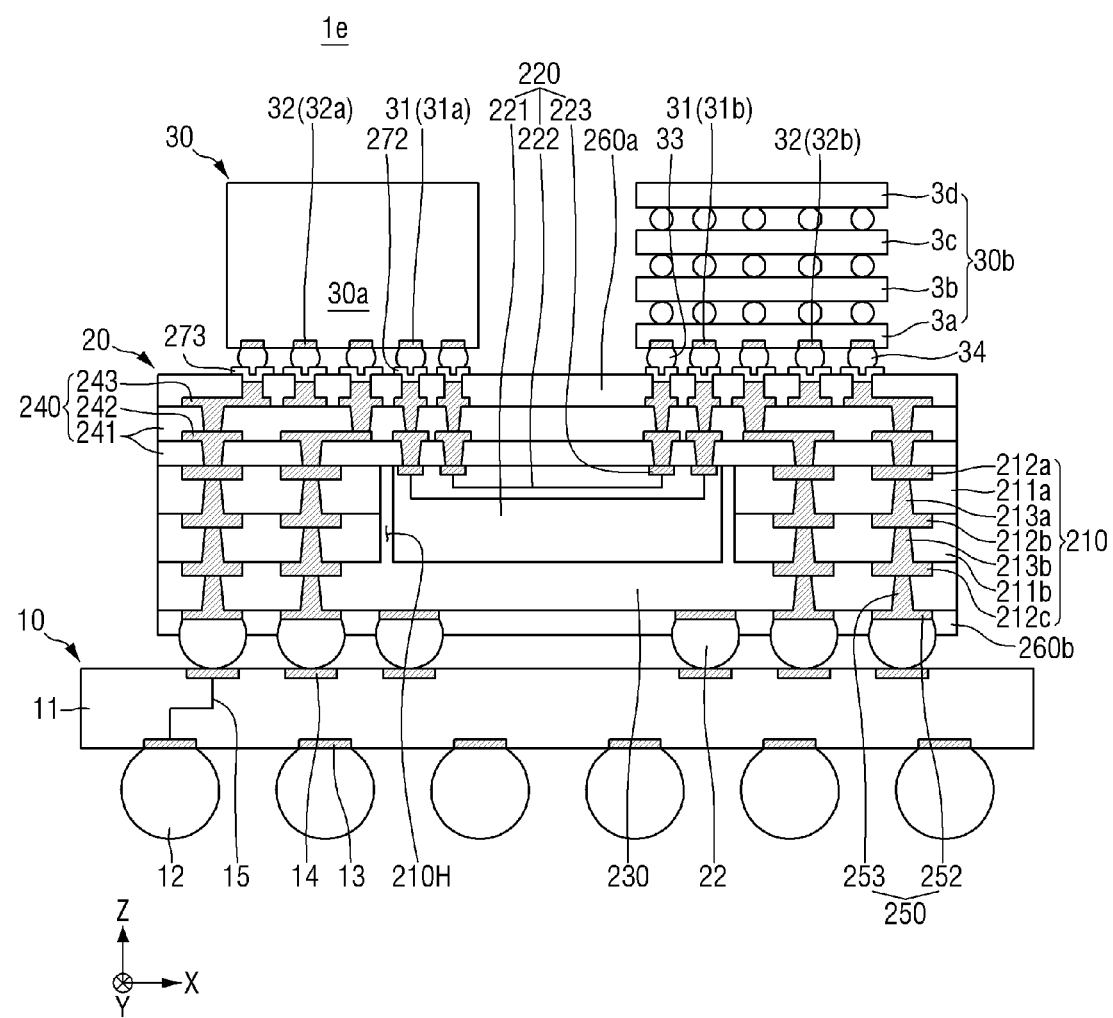
FIG. 8 is a cross-sectional view of a semiconductor package according to embodiments of the present disclosure.

FIG. 6 is a cross-sectional view of a semiconductor package 1c according to embodiments of the present disclosure. FIG. 7 is a cross-sectional view of a semiconductor package 1d according to embodiments of the present disclosure. FIG. 8 is a cross-sectional view of a semiconductor package 1e according to embodiments of the present disclosure. For ease of description, repeated description of the same elements and features as those described with reference to FIGS. 1 through 3 may not be provided below.

Referring to FIG. 6, the semiconductor package 1c may include conductive connection structures 110 disposed around a bridge chip 220 and electrically connecting first redistribution layers 242 and third redistribution layers 252. In the semiconductor package 1c, each of the conductive connection structures 110 may be in the form of a conductive post penetrating an encapsulant 230, not in the form of a stack of an insulating layer and a conductive layer. In this case, a second redistribution structure 250 may be formed on a flat surface formed by grinding a surface of the encapsulant 230 to expose the conductive connection structures 110. The second redistribution structure 250 may include an insulating layer 251 on the flat surface of the encapsulant 230, the third redistribution layers 252 on the insulating layer 251, and third redistribution vias 253 penetrating the insulating layer 251 to electrically connect the third redistribution layers 252 and the conductive connection structures 110.

Among the elements illustrated in FIG. 6, elements having the same reference numerals as those of FIGS. 1 and 2 have similar technical features to those of FIGS. 1 and 2 and thus repeated descriptions thereof may not be provided.

Referring to FIG. 7, the semiconductor package 1d may further include passive components P disposed on a second surface of a first redistribution structure 240 and electrically connected to at least one of the first semiconductor chip 30a and the second semiconductor chip 30b through a first redistribution layer 242 and a second redistribution layer 243. A connection structure 210 may have a second through hole 210H2 accommodating the passive components P. The second through hole 210H2 may be spaced apart from a first through hole 210H1 accommodating a bridge chip 220. The passive components P may be surrounded by a first frame insulating layer 211a and a second frame insulating layer 211b that form inner walls of the second through hole 210H2.

Each of the passive components P may be a capacitor such as a multilayer ceramic capacitor (MLCC) or a low inductance chip capacitor (LICC), an inductor such as a power inductor, a bead, or the like. The number of the passive components P is not particularly limited and may be more or less than the number of the passive components P illustrated in FIG. 7.

Among the elements illustrated in FIG. 7, elements having the same reference numerals as those of FIGS. 1 and 2 have similar technical features to those of FIGS. 1 and 2 and thus repeated descriptions thereof may not be provided.

Referring to FIG. 8, in the semiconductor package 1e, a second semiconductor chip 30b may include a semiconductor chip stack (e.g., a high bandwidth memory (HBM) device) in which a plurality of semiconductor chips 3a, 3b, 3c and 3d are stacked in a direction (Z direction) perpendicular to an upper surface of an interposer package 20 or a first surface of a first redistribution structure 240.

Among the elements illustrated in FIG. 8, elements having the same reference numerals as those of FIGS. 1 and 2 have similar technical features to those of FIGS. 1 and 2 and thus repeated descriptions thereof may not be provided.

FIGS. 9 through 12 are views schematically illustrating a method of fabricating a semiconductor package according to embodiments of the present disclosure. For ease of description, repeated description of the same elements and features as those described with reference to FIGS. 1 through 3 may not be provided below.

Figure 9:
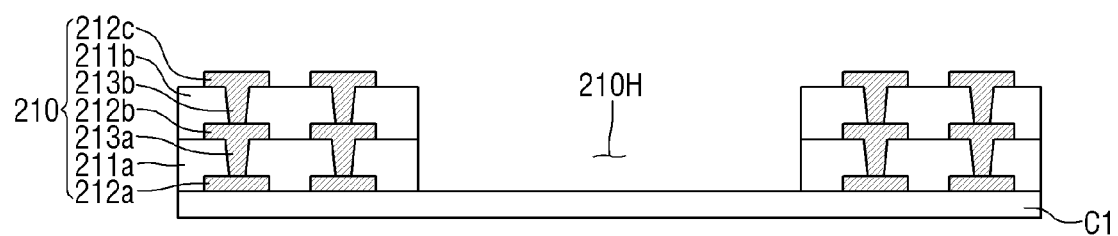
FIGS. 9 through 12 are views schematically illustrating a method of fabricating a semiconductor package according to embodiments of the present disclosure.

Referring to FIG. 9, first, a connection structure 210 having a through hole 210H may be attached to a first carrier C1. The through hole 210H may be formed by partially removing the first frame insulating layer 211a and the second frame insulating layer 211b of the connection structure 210 using a physical or chemical method. For example, the through hole 210H may be formed using a laser drill.

Figure 10:
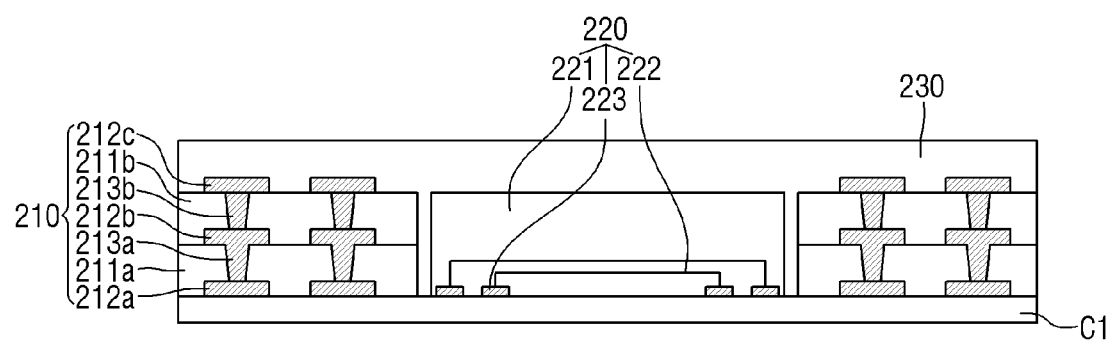

Referring to FIG. 10, a bridge chip 220 may be placed in the through hole 210H of the connection structure 210, and an encapsulant 230 for encapsulating the connection structure 210 and the bridge chip 220 may be formed. The connection structure 210 and the bridge chip 220 may have substantially the same height. The encapsulant 230 may fill the through hole 210H and cover upper surfaces of the bridge chip 220 and the connection structure 210. The encapsulant 230 may be an EMC including epoxy resin.

Figure 11:
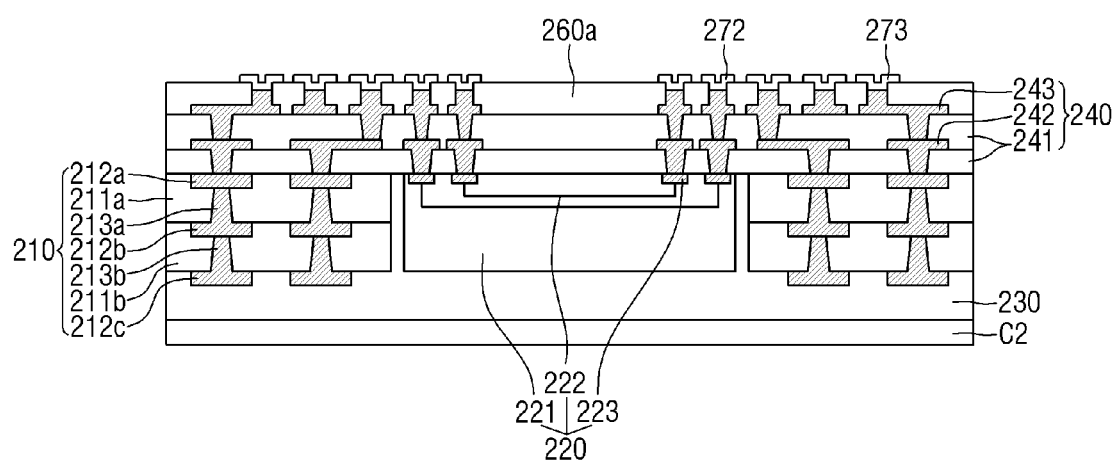
Figure 18:
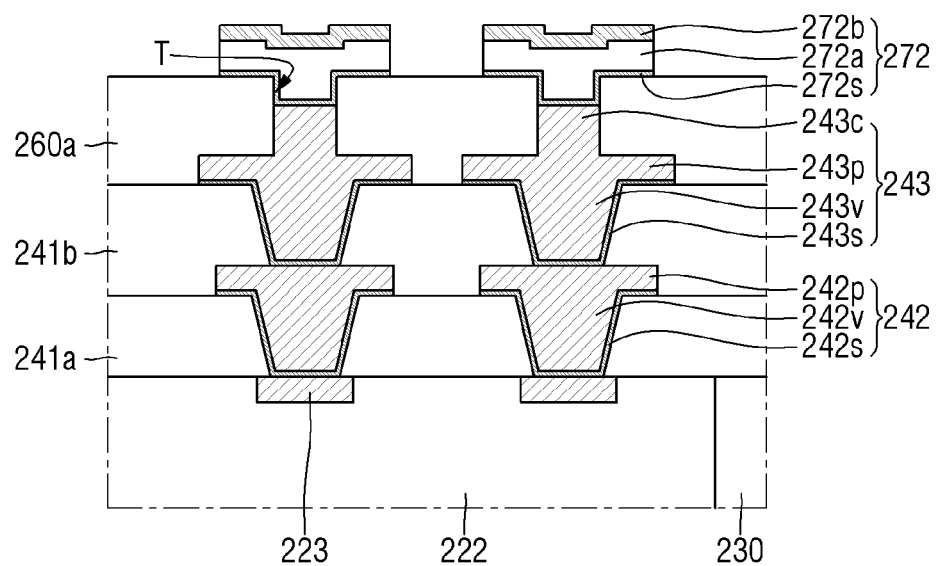

Referring to FIG. 11, after the first carrier C1 of FIG. 10 is removed, the side on which the encapsulant 230 is formed may be attached to a second carrier C2, and a first redistribution structure 240 may be formed on the connection structure 210 and the bridge chip 220. Referring also to FIG. 18 which will be described later, the first redistribution structure 240 may include insulating layers 241 covering the connection structure 210 and the bridge chip 220, a first redistribution via 242v and a second redistribution via 243v penetrating the insulating layers 241, and a first redistribution via pad 242p and a second redistribution via pad 243p disposed on the first redistribution via 242v and the second redistribution via 243v to extend along surfaces of the insulating layers 241. The insulating layers 241 may include a photosensitive resin, and the first redistribution via 242v, the second redistribution via 243v, the first redistribution via pad 242p, and the second redistribution via pad 243p may be formed by a photolithography process and a plating process as will be described later.

In addition, a third insulating layer 260a covering the first redistribution layer 242, the second redistribution layer 243, the first bonding structure 272, and the second bonding structure 273 penetrating the third insulating layer 260a may be formed. The third insulating layer 260a may include solder resist. A metal plating layer may be formed on surfaces of the first bonding structure 272 and the second bonding structure 273. The metal plating layer may have, for example, a multilayer structure in which a nickel (Ni) layer and a gold (Au) layer are stacked.

Figure 12:
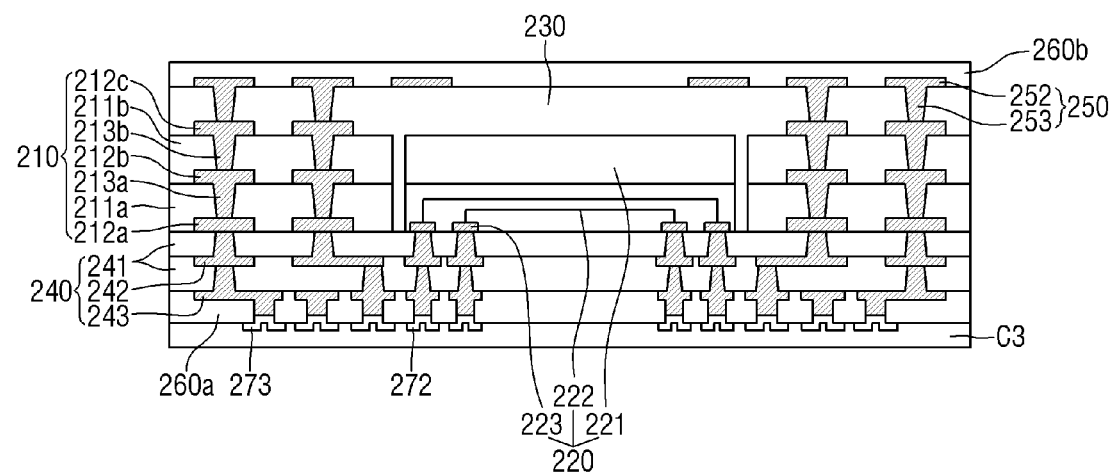

Referring to FIG. 12, after the second carrier C2 of FIG. 11 is removed, the side on which the first redistribution structure 240 is formed may be attached to a third carrier C3, and second redistribution structures 250 may be formed on the encapsulant 230. Each of the second redistribution structures 250 may include a third redistribution via 253, penetrating the encapsulant 230 which covers the upper surface of the connection structure 210 and connected to a wiring layer 212c, and may further include third redistribution layer 252 disposed on the third redistribution via 253 to extend along a surface of the encapsulant 230. The second redistribution structures 250 may be formed of the same material and in the same process as the first redistribution structure 240.

Next, referring to FIG. 2, first internal connection bumps 22 may be formed on the third redistribution layers 252, and the third carrier C3 of FIG. 12 may be removed. Then, a first semiconductor chip 30a and a second semiconductor chip 30b may be mounted on the first redistribution structure 240 using second internal connection bumps 33 and third internal connection bumps 34. An interposer package 20 on which the first semiconductor chip 30a and the second semiconductor chip 30b are mounted may be mounted on a base substrate 10 through the first internal connection bumps 22.

FIGS. 13 through 18 are views schematically illustrating a method of fabricating a semiconductor package according to embodiments of the present disclosure. For reference, FIGS. 13 through 18 are views for explaining a method of fabricating the semiconductor package of FIG. 3. For ease of description, repeated description of the same elements and features as those described with reference to FIGS. 1 through 3 may not be provided below.

Referring to FIG. 13, first via holes 241a_h penetrating at least a portion of a first insulating layer 241a may be formed. Then, a first metal layer 242s may be conformally formed along sidewalls and a bottom surface of each first via hole 241a_h and an upper surface of the first insulating layer 241a.

A first redistribution via 242v may be formed on the first metal layer 242s to fill each first via hole 241a_h, and a first redistribution via pad 242p may be formed on the first redistribution via 242v. Although not specifically illustrated, the first metal layer 242s, the first redistribution via 242v, and the first redistribution via pad 242p may be formed using a photoresist patterning process.

The first metal layer 242s may be a seed layer, and the first redistribution via 242v and the first redistribution via pad 242p may be plating layers. For example, the first redistribution via 242v and the first redistribution via pad 242p may include copper (Cu), and the first metal layer 242s may include at least one or a combination of titanium (Ti), TiW, tantalum (Ta), copper (Cu), and nickel (Ni).

Next, a second insulating layer 241b may be formed on the first redistribution layers 242, and second via holes 241b_h penetrating at least a portion of the second insulating layer 241b may be formed. Then, a second metal layer 243s may be conformally formed along sidewalls and a bottom surface of each second via hole 241b_h and an upper surface of the second insulating layer 241b. First resist patterns PR1 may be formed on the second metal layer 243s, and a second redistribution via 243v and a second redistribution via pad 243p may be formed in each opening O between the first resist patterns PR1.

The second metal layer 243s may be a seed layer, and the second redistribution via 243v and the second redistribution via pad 243p may be plating layers. For example, the second redistribution via 243v and the second redistribution via pad 243p may include copper (Cu), and the second metal layer 243s may include at least one or a combination of titanium (Ti), TiW, tantalum (Ta), copper (Cu), and nickel (Ni).

Figure 14:
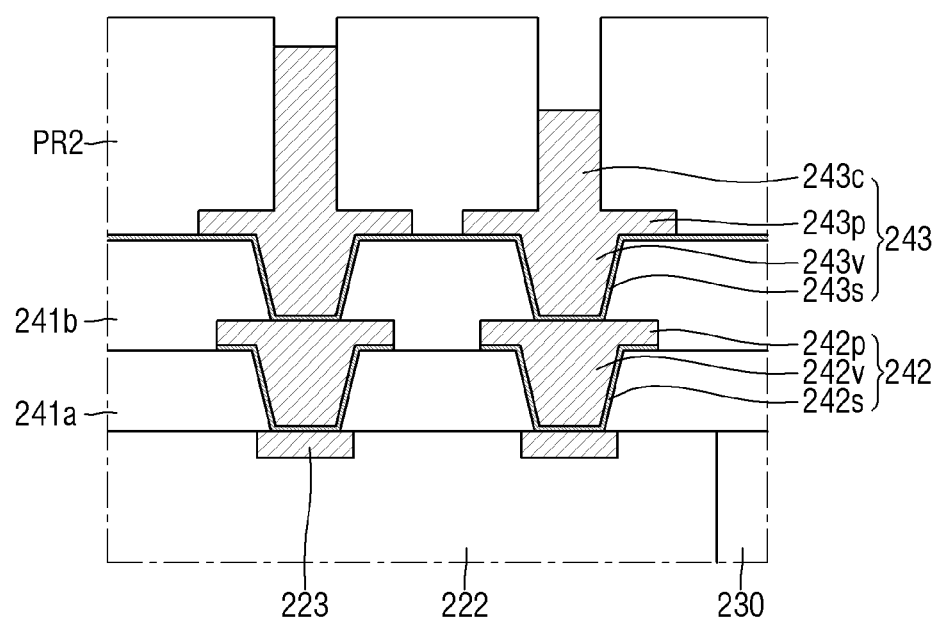

Referring to FIG. 14, the first resist patterns PR1 may be removed. Then, second resist patterns PR2 partially covering the second redistribution via pads 243p may be formed, and contact plugs 243c may be formed between the second resist patterns PR2. The contact plugs 243c may include copper (Cu). The contact plugs 243c may be formed by electroplating.

Figure 15:
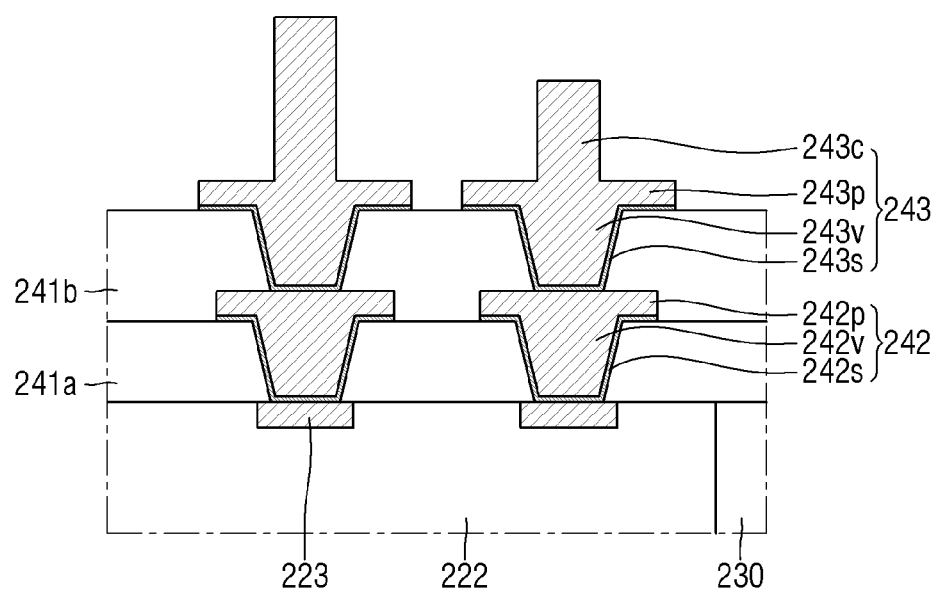

Referring to FIG. 15, the second resist patterns PR2 are removed to expose the contact plugs 243c. Of the second metal layer 243s on the second insulating layer 241b, a portion of the second metal layer 243s in an area where the second redistribution via pads 243p are not formed may be removed.

Figure 16:
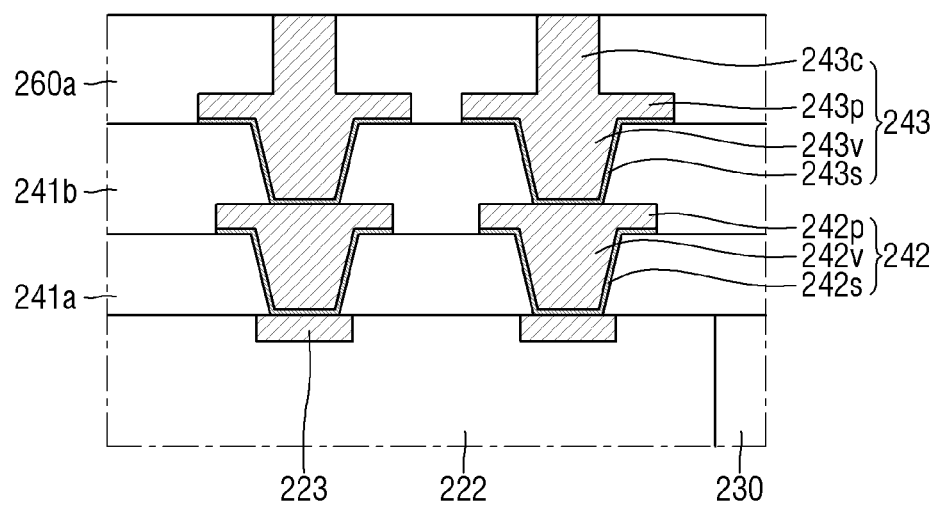

Referring to FIG. 16, a third insulating layer 260a may be formed on the second redistribution layers 243 and the contact plugs 243c, and upper surfaces of the contact plugs 243c and an upper surface of the third insulating layer 260a may be positioned on the same plane using a planarization process.

Figure 17:
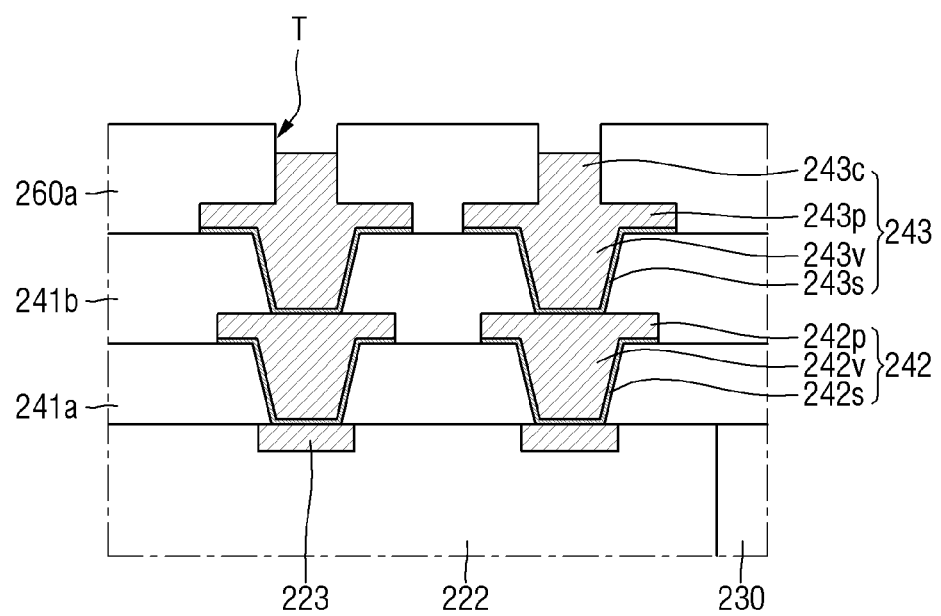

Referring to FIG. 17, each of the contact plugs 243c may be partially removed using an etch-back process to form a trench T between the upper surface of each of the contact plugs 243c and the upper surface of the third insulating layer 260a.

Referring to FIG. 18, a third metal layer 272s may be conformally formed along sidewalls and a bottom surface of each trench T and the upper surface of the third insulating layer 260a. Although not specifically illustrated, third resist patterns may be formed on the third metal layer 272s, and a first bonding pad 272a and a second bonding pad 272b may be formed between the third resist patterns to form each first bonding structure 272. Then, the third resist patterns may be removed, and a portion of the third metal layer 272s may be removed to form a first redistribution structure 240 (see FIG. 2) and each first bonding structure 272 illustrated in FIG. 3.

The third metal layer 272s may be a seed layer, and the first bonding pad 272a and the second bonding pad 272b may be plating layers. For example, the first bonding pad 272a and the second bonding pad 272b may include nickel (Ni) and gold (Au), respectively, and the third metal layer 272s may include at least one or a combination of titanium (Ti), TiW, tantalum (Ta), copper (Cu), and nickel (Ni).

While non-limiting example embodiments of the present disclosure has been particularly illustrated and described, it will be understood by those of ordinary skill in the art that various changes in form and detail may be made therein without departing from the spirit and scope of the present disclosure. The example embodiments should be considered in a descriptive sense only and not for purposes of limitation.

What is claimed is:

1. A semiconductor package comprising:
a base substrate;
an interposer package on the base substrate; and
a first semiconductor chip and a second semiconductor chip on the interposer package,
wherein the interposer package comprises:
a first redistribution structure having a first surface on which the first semiconductor chip and the second semiconductor chip are disposed and a second surface facing in a direction opposite to a facing direction of the first surface, the first redistribution structure comprising:
a first insulating layer;

a second insulating layer on the first insulating layer;
a first redistribution layer on the first insulating layer; and
a second redistribution layer on the second insulating layer;
a bridge chip on the second surface of the first redistribution structure and comprising a bridge circuit electrically connecting the first semiconductor chip and the second semiconductor chip;
a connection structure on the second surface of the first redistribution structure and comprising a plurality of wiring layers electrically connected to the first semiconductor chip and the second semiconductor chip;
a third insulating layer on the second insulating layer; and
bonding structures on the third insulating layer that bond each of the first semiconductor chip and the second semiconductor chip to the first redistribution structure, and
wherein the second redistribution layer comprises, within the third insulating layer, a contact plug protruding from an upper surface of a portion of the second redistribution layer and disposed between the portion of the second redistribution layer and one of the bonding structures.

2. The semiconductor package of claim 1, wherein the contact plug comprises:
a lower surface contacting the upper surface of the portion of the second redistribution layer;
an upper surface facing away from the lower surface of the contact plug and contacting the one of the bonding structures; and
a sidewall connecting the upper surface of the contact plug and the lower surface of the contact plug,
wherein the sidewall of the contact plug contacts the third insulating layer.

3. The semiconductor package of claim 1, wherein the upper surface of the contact plug is at a lower level than a level of an upper surface of the third insulating layer.

4. The semiconductor package of claim 2, wherein the sidewall of the contact plug has a constant slope with respect to a direction parallel to an upper surface of the base substrate.

5. The semiconductor package of claim 1, wherein the first redistribution layer comprises:
a first metal layer formed along a first via hole penetrating at least a portion of the first insulating layer,
a first redistribution via on the first metal layer and filling the first via hole; and
a first redistribution via pad on the first redistribution via, and
the second redistribution layer further comprises:
a second metal layer formed along a second via hole penetrating at least a portion of the second insulating layer,
a second redistribution via on the second metal layer and filling the second via hole; and
a second redistribution via pad on the second redistribution via,
wherein the contact plug and the second redistribution via pad directly contact each other.

6. The semiconductor package of claim 5, wherein a sum of a thickness of the contact plug and a thickness of the second redistribution via is greater than a thickness of the first redistribution via in a direction perpendicular to an upper surface of the base substrate.

7. The semiconductor package of claim 1, wherein the one of the bonding structures comprises:
a third metal layer formed along a trench penetrating at least a portion of the third insulating layer;
a first bonding pad on the third metal layer and filling the trench; and
a second bonding pad on the first bonding pad;
wherein the contact plug and the third metal layer directly contact each other.

8. The semiconductor package of claim 7, wherein a recess is within an upper surface of the second bonding pad to correspond to the trench.

9. The semiconductor package of claim 7, wherein a width of a sidewall of the contact plug and a width of the trench in the third insulating layer in the direction parallel to an upper surface of the base substrate are equal to each other.

10. The semiconductor package of claim 1, wherein the interposer package further comprises:
an encapsulant on the second surface of the first redistribution structure and encapsulating the bridge chip and the connection structure; and
a second redistribution structure comprising a third redistribution layer on the encapsulant and electrically connected to the plurality of wiring layers of the connection structure, and
wherein at least one of the first semiconductor chip and the second semiconductor chip are electrically connected to the bridge circuit and the plurality of wiring layers through the first redistribution layer and the second redistribution layer.

11. The semiconductor package of claim 1, wherein the third insulating layer comprises a non-photosensitive material.

12. A semiconductor package comprising:
a base substrate;
an interposer package on the base substrate; and
a plurality of semiconductor chips on the interposer package,
wherein the interposer package comprises:
a first redistribution structure having a first surface on which the plurality of semiconductor chips are disposed and a second surface facing in a direction opposite to a facing direction of the first surface, the first redistribution structure comprising:
a first insulating layer;
a second insulating layer on the first insulating layer;
a first redistribution layer on the first insulating layer; and
a second redistribution layer on the second insulating layer;
a bridge chip on the second surface of the first redistribution structure and comprising a bridge circuit electrically connecting the plurality of semiconductor chips;
a connection structure on the second surface of the first redistribution structure and comprising a plurality of wiring layers electrically connected to the plurality of semiconductor chips;
a third insulating layer on the second insulating layer; and
bonding pads on the third insulating that bond each of the plurality of semiconductor chips to the first redistribution structure,
wherein the first redistribution structure further comprises:
a first via structure that is above the first redistribution layer; and a second via structure that is between the first via structure and one of the bonding pads, and wherein the second via structure comprises:

a first metal layer contacting an upper surface of a portion of the second redistribution layer;

a second metal layer contacting the one of the bonding pads; and a third metal layer between the first metal layer and the second metal layer.

13. The semiconductor package of claim 12, wherein the first metal layer is integrally formed with the portion of the second redistribution layer.

14. The semiconductor package of claim 12, wherein the first metal layer and the third metal layer directly contact the third insulating layer, and the second metal layer does not directly contact the third insulating layer.

15. The semiconductor package of claim 12, wherein a height of an upper surface of the first metal layer is lower than a height of an upper surface of the third insulating layer.

16. The semiconductor package of claim 12, wherein a thickness of the first metal layer is greater than a thickness of the second metal layer in a direction perpendicular to an upper surface of the base substrate.

17. A method of fabricating a semiconductor package that includes a first redistribution structure electrically connecting a semiconductor chip and a bridge chip, a connection structure including a plurality of wiring layers connected to the semiconductor chip, and a bonding structure on the first redistribution structure and bonded to the semiconductor chip, the method comprising:

forming the first redistribution structure, the forming comprising:

forming a first insulating layer on the bridge chip, a first redistribution layer on the first insulating layer, and a second insulating layer on the first redistribution layer;

forming a portion of a second redistribution layer on the second insulating layer using a first resist pattern;

removing the first resist pattern and forming a contact plug on the portion of the second redistribution layer using a second resist pattern;

removing the second resist pattern and forming a third insulating layer on the contact plug;

performing a planarization process so that an upper surface of the contact plug and an upper surface of the third insulating layer are positioned on a same plane; and forming a trench between the upper surface of the contact plug and the upper surface of the third insulating layer by removing a portion of the contact plug; and providing the bonding structure in the trench.

18. The method of claim 17, wherein the contact plug and the second redistribution layer are made of a same material.

19. The method of claim 17, wherein a sidewall of the contact plug directly contacts the third insulating layer.

20. The method of claim 17, wherein the bonding structure includes a recess in an upper surface of the bonding structure, the recess corresponding to the trench.

\* \* \* \* \*